(12) United States Patent
Yoshida et al.

(10) Patent No.: US 9,265,175 B2
(45) Date of Patent: Feb. 16, 2016

(54) FAN CHASSIS, FAN UNIT, AND COMMUNICATION DEVICE

(75) Inventors: Kazuki Yoshida, Tokyo (JP); Sadaaki Miyamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 210 days.

(21) Appl. No.: 14/008,039

(22) PCT Filed: Mar. 28, 2012

(86) PCT No.: PCT/JP2012/058078
§ 371 (c)(1),
(2), (4) Date: Sep. 27, 2013

(87) PCT Pub. No.: WO2012/133497
PCT Pub. Date: Oct. 4, 2012

(65) Prior Publication Data
US 2014/0016269 A1    Jan. 16, 2014

(30) Foreign Application Priority Data

Mar. 30, 2011  (JP) .................................. 2011-074736

(51) Int. Cl.
*H05K 7/20*  (2006.01)
*F04D 29/64*  (2006.01)
(Continued)

(52) U.S. Cl.
CPC .......... *H05K 7/20172* (2013.01); *F04D 29/646* (2013.01); *H05K 7/20727* (2013.01); *F04B 39/14* (2013.01); *H05K 7/20581* (2013.01); *H05K 7/20736* (2013.01)

(58) Field of Classification Search
CPC .......... H05K 7/20172; H05K 7/20581; H05K 7/20736; H05K 7/20572; F04D 29/646; F04D 29/4226; F04D 29/60–29/648

USPC ........ 361/679.46–679.54, 688–723; 417/360; 415/206
See application file for complete search history.

(56) References Cited

U.S. PATENT DOCUMENTS 4,834,615 A * 5/1989 Mauch et al. .............. 415/213.1
6,236,564 B1   5/2001 Fan
(Continued)

FOREIGN PATENT DOCUMENTS

JP    5-83635 U    11/1993
JP    10-178291 A  6/1998
(Continued)

OTHER PUBLICATIONS

International Search Report for PCT/JP2012/058078 dated May 22, 2012.

*Primary Examiner* — Zachary M Pape
(74) *Attorney, Agent, or Firm* — Sughrue Mion, PLLC (57) ABSTRACT

A fan chassis includes: a wall panel; and an upper panel that is connected to an upper end of the wall panel, and a lower panel that is connected to a lower end of the wall panel. A cross sectional shape of the upper panel and the lower panel is substantially U-shape. The wall panel includes a plurality of projections to be inserted into mounting holes of a fan. At least either one of the upper panel and the lower panel includes a through hole into which an upper end part or a lower end part of the fan is to be fitted. An inner dimension between the upper panel and the lower panel is shorter than an outer dimension of the fan in a vertical direction. The upper panel and the lower panel deform elastically in a direction in which the upper panel and the lower panel move apart from each other.

8 Claims, 9 Drawing Sheets

(51) Int. Cl.
*F04D 29/00* (2006.01)
*F04B 39/00* (2006.01)
*F04B 39/14* (2006.01)

(56) References Cited

U.S. PATENT DOCUMENTS

| 6,317,320 | B1 | 11/2001 | Cosley et al. |
| 7,134,896 | B1 * | 11/2006 | Chen ............................. 439/326 |
| 2013/0100613 | A1 * | 4/2013 | Nakai ........................... 361/695 |

FOREIGN PATENT DOCUMENTS

| JP | 10-200280 A | 7/1998 |
| JP | 2001-99098 A | 4/2001 |
| JP | 2005-51085 A | 2/2005 |
| JP | 2006-73957 A | 3/2006 |
| WO | WO 2012002225 A1 * | 1/2012 |

* cited by examiner

FAN CHASSIS, FAN UNIT, AND COMMUNICATION DEVICE

CROSS REFERENCE TO RELATED APPLICATIONS

This application is a National Stage of International Application No. PCT/JP2012/058078 filed Mar. 28, 2012, claiming priority based on Japanese Patent Application No. 2011-074736 filed Mar. 30, 2011, the contents of all of which are incorporated herein by reference in their entirety.

TECHNICAL FIELD

The present invention relates to a fan chassis that constitutes a fan unit that has an object of releasing heat of the casing interior of a communication device, a fan unit that includes this fan chassis, and a communication device that includes this fan unit.

BACKGROUND ART

Heretofore, when operating an electronic device such as a server or a communication device that has a plurality of built-in printed circuit boards in the interior of the casing, a fan, in which a fan and an electric motor are integrated (also referred to as a fan motor), is generally used to discharge heat within the casing. For example, Patent Document 1 discloses a method of attaching a fan to a communication device. In this method, unitization is realized by attaching a fan to a chassis that is formed by means of sheet metal working. Then, this fan unit is inserted and fixed in a slot provided in the front surface of the casing of the communication device.

The fan unit is provided with a control circuit board for supplying electric power and for control, and a connector that is provided on this control circuit board to electrically connect the communication device body and the control circuit board. The type of this connector is generally a type that completes connection to the mother board of the casing by inserting the fan unit into the slot (hereunder, referred to as plug-in unit type). The slot includes a guide structure for connecting the fan unit to the mother board. Moreover, between the inner wall of the slot and the fan unit, there is required a clearance necessary for absorbing manufacturing tolerances of each component.

[Patent Document 1] Japanese Unexamined Patent Application, First Publication No. H10-178291

SUMMARY OF THE INVENTION

Problem to be Solved by the Invention

In a conventional fan unit, fastening components such screws are used in general in order to fix a fan onto a chassis. When using fastening components, problems are reduction in the number of components, reduction in assembly processing steps, and simplification of the assembly method.

Means for Solving the Problem

In order to solve the above problems, the present invention provides the following measures.

A fan chassis according to the present invention includes: a wall panel; and an upper panel that is connected to an upper end of the wall panel, and a lower panel that is connected to a lower end of the wall panel. A cross sectional shape of the upper panel and the lower panel is substantially U-shape. The wall panel includes a plurality of projections to be inserted into mounting holes of a fan. At least either one of the upper panel and the lower panel includes a through hole into which an upper end part or a lower end part of the fan is to be fitted. An inner dimension between the upper panel and the lower panel is shorter than an outer dimension of the fan in a vertical direction. The upper panel and the lower panel deform elastically in a direction in which the upper panel and the lower panel move apart from each other.

According to this configuration, the fan chassis has a structure for retaining a fan. Accordingly, there is no need for screws for fixing the fan when manufacturing the fan unit. As a result, it is possible to reduce the number of components and reduce assembly processing steps.

Effect of the Invention

According to the fan chassis of the present invention, the fan chassis has a structure for retaining a fan. Accordingly, there is no need for screws for fixing the fan when manufacturing the fan unit. As a result, it is possible to reduce the number of components and reduce assembly processing steps.

EMBODIMENTS FOR CARRYING OUT THE INVENTION

Hereunder, an exemplary embodiment of the present invention is described in detail, with reference to the drawings.

Figure 1:
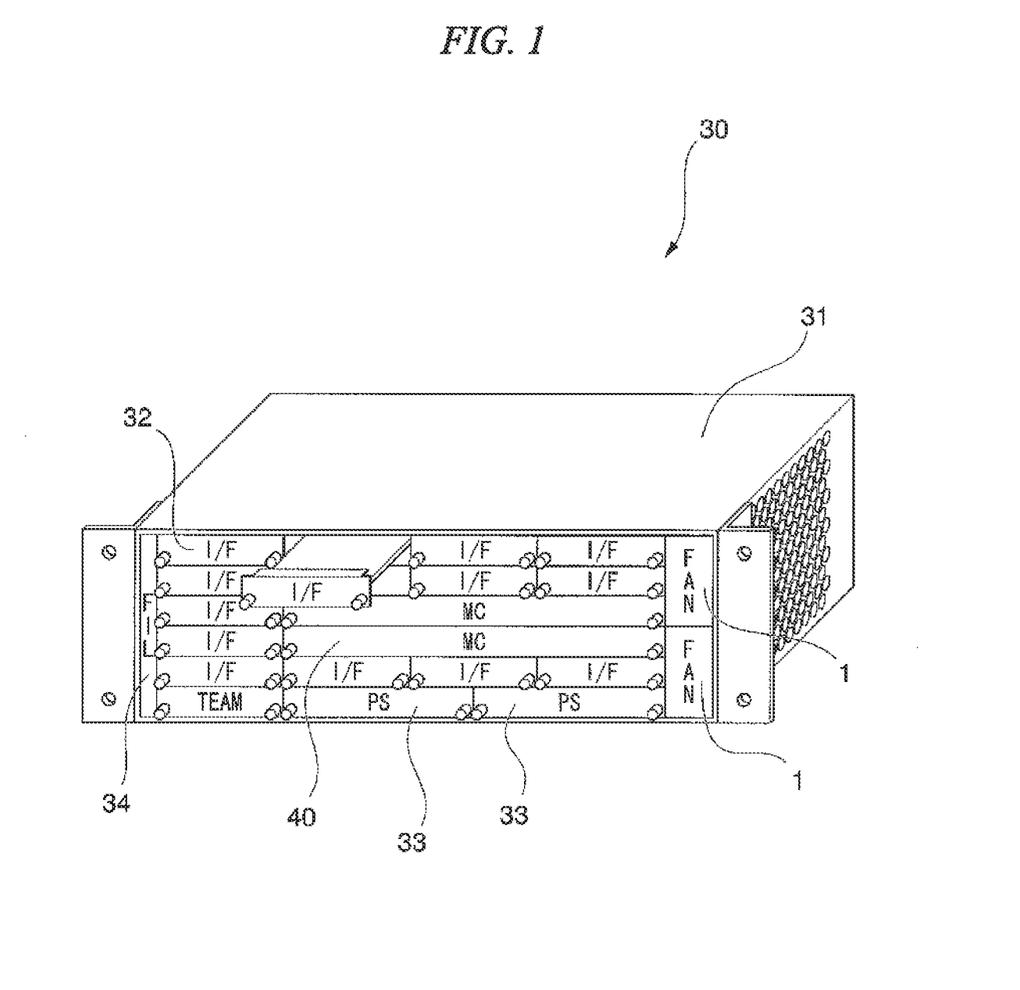
FIG. 1 is a perspective view of a communication device to which a fan unit of a present exemplary embodiment is applied.

As shown in FIG. 1, a fan unit 1 of the present exemplary embodiment is built into a communication device 30 of an indoor unit of a wireless communication system. The communication device 30 includes a casing 31, a plurality of communication units 32, a printed circuit board 40, two fan units 1, a power supply unit 33, and a filter 34. The casing 31 is of a rectangular parallelepiped shape. The plurality of communication units 32 are mounted in the casing 31. The printed circuit board 40 is, for example, a control circuit board.

Figure 2:
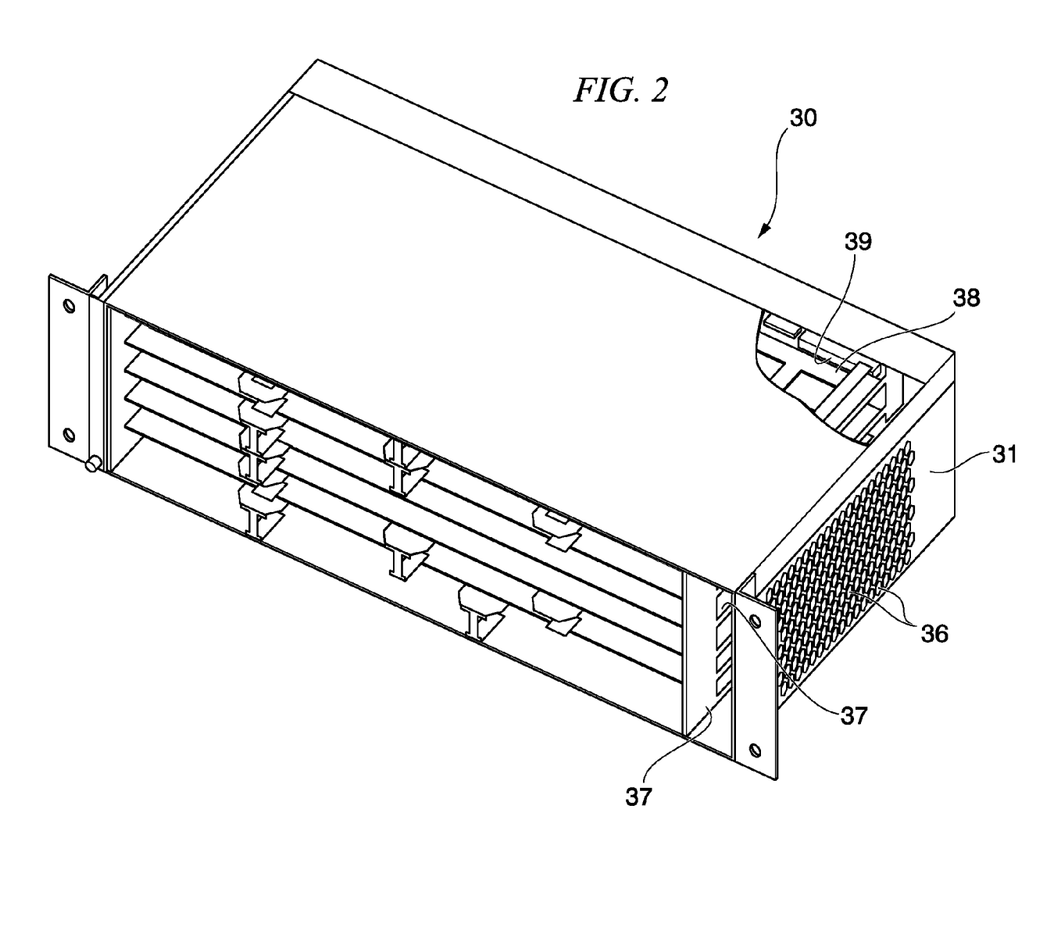
FIG. 2 is a perspective view of a casing and a mother board of the communication device to which the fan unit of the present exemplary embodiment is applied.

As shown in FIG. 2, in the back part of the casing 31, there is arranged a mother board 38. The communication units 32, the printed circuit board 40, the fan units 1, and the power unit 33 are connected via an MB connector 39 on the mother board 38. The fan unit 1 is not limited to being used for this type of communication device. The fan unit 1 may be used to prevent a temperature increase in the device interior of an electronic device such as a server device or a PC.

In the front surface of the casing 31, there is formed an opening. On both of the side surfaces of the casing 31, there are formed a plurality of ventilation holes 36. Hereunder, the direction orthogonal to the surface that forms the opening of the casing 31 is referred to as depth direction. The horizontal direction orthogonal to the depth direction is referred to as left-right direction. Moreover, the right hand side when viewed from the opening side is referred to as right side. The left hand side when viewed from the opening side is referred to as left side. Furthermore, the opening side in the depth direction is referred to as front side. The side opposite of the front side in the depth direction is referred to as rear side.

Two slots 37 are provided on one side of the casing 31. The two fan units 1 are respectively attached so as to be freely inserted into or removed from the two slots 37. The cross section of the slot 37 is of a vertically long rectangular shape. The slot 37 is long in the depth direction. The fan unit 1 has a control connector 5 (refer to FIG. 3). The configuration is made such that the control connector 5 is connected to the mother board 38 by inserting the fan unit 1 along the slot 37.

The fan unit 1 is configured so as to extract air from the interior of the casing 31 and discharge the air through the ventilation holes 36. The filter 34 is configured so as to block dust and grit that may be contained in the air flowing into the interior of the casing 31 as the fan unit 1 discharges the air.

Figure 3:
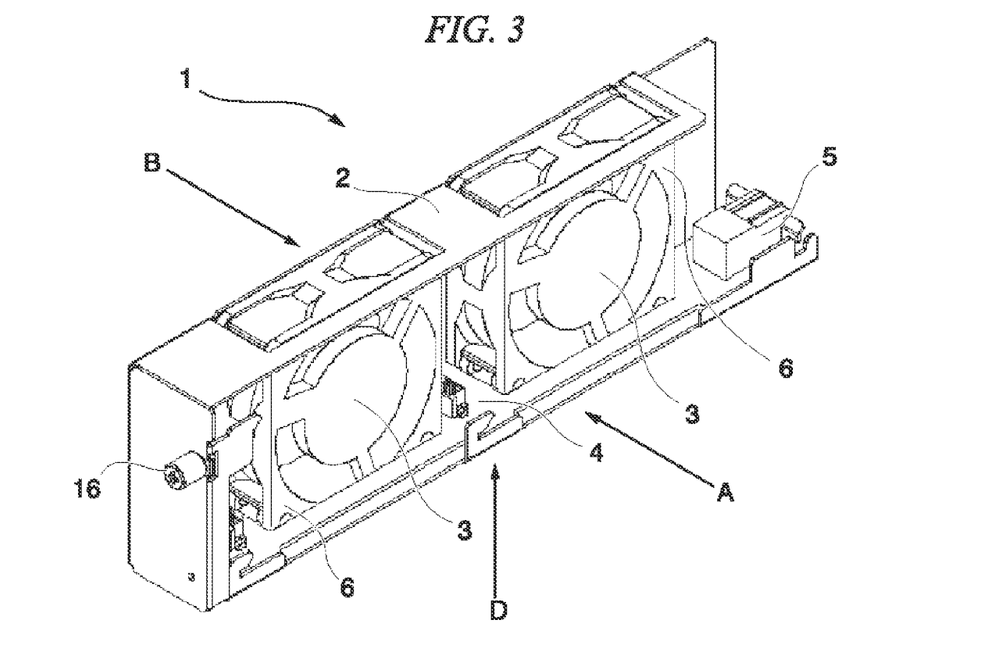
FIG. 3 is a perspective view of the fan unit of the present exemplary embodiment.

As shown in FIG. 3, the fan unit 1 includes a fan chassis 2, two fan main bodies 3, and a control circuit board 4 fixed on the fan chassis 2. The fan chassis 2 is formed by means of sheet metal working. The two fan main bodies 3 are accommodated in the fan chassis 2. The control circuit board 4 is fixed on the fan chassis 2. The fan main body 3 is a cooling fan having a rectangular casing 6. The two fan main bodies 3 are arranged lined in the depth direction. The two fan main bodies 3 are arranged so that the air blowing direction thereof faces the left-right direction. At the rear end (second end) of the control circuit board 4, there is provided the control connector 5.

Figure 4:
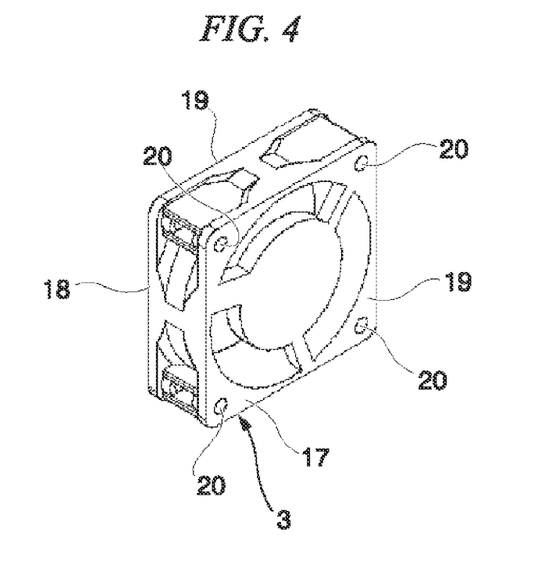
FIG. 4 is a perspective view of a fan main body that constitutes the fan unit of the present exemplary embodiment.

As shown in FIG. 4, the fan main body 3 includes a casing 6. The casing 6 is of a rectangular parallelepiped shape, and it is of a square shape when seen in side view. The casing 6 includes two square ribs 19 that form one surface 17 and other surface 18. In the four corners of the ribs 19, there are formed attachment holes 20 that pass through from the one surface 17 to the other surface 18.

The fan main body 3 is configured so that wind load is generated from the one surface 17 toward the other surface 18.

Figure 5:
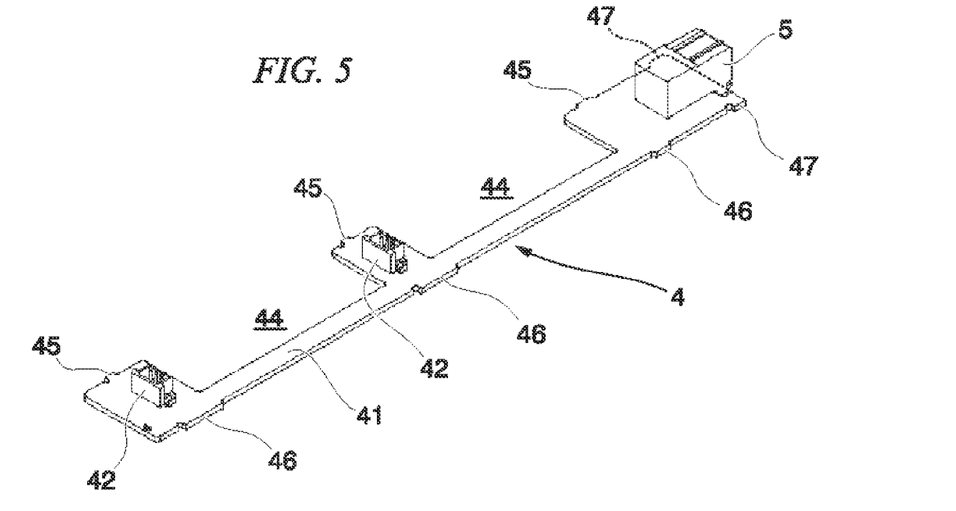
FIG. 5 is a perspective view of a control circuit board that constitutes the fan unit of the present exemplary embodiment.

As shown in FIG. 5, the control circuit board 4 includes a circuit board part 41, two fan connectors 42, and a control connector 5. The control connector 5 is attached to the rear end of the circuit board part 41. The circuit board part 41 of the control circuit board 4 is installed so as to be parallel with the upper panel 12 and the lower panel 14 of the fan chassis 2 as shown in FIG. 3.

The circuit board part 41 is a printed circuit board composed of an insulator base material. The circuit board part 41 is of a rectangular shape, and has substantially the same shape as that of the fan chassis 2 when seen in plan view. In the circuit board part 41 there are formed two notch parts 44 for avoiding interference with the two fan main bodies 3.

On the side, which is one edge of the circuit board part 41 in the left-right direction, where the notch parts 44 are formed, there are formed three first projection pieces (first projection part) 45. The first projection pieces 45 are to be inserted into first insertion parts 25 of the fan chassis 2 described later.

On the other edge that is opposite to the one edge of the circuit board part 41 in the left-right direction, there are formed three second projection pieces (second projection part) 46. The second projection pieces 46 are to be inserted into second insertion parts 51 of the fan chassis 2 described later.

At the rear end of the circuit board part 41 there is formed a third projection piece (third projection part) 47 that projects in the left-right direction. The third projection piece 47 is to be inserted into a first insertion part 53 of the fan chassis 2 described later.

Figure 7:
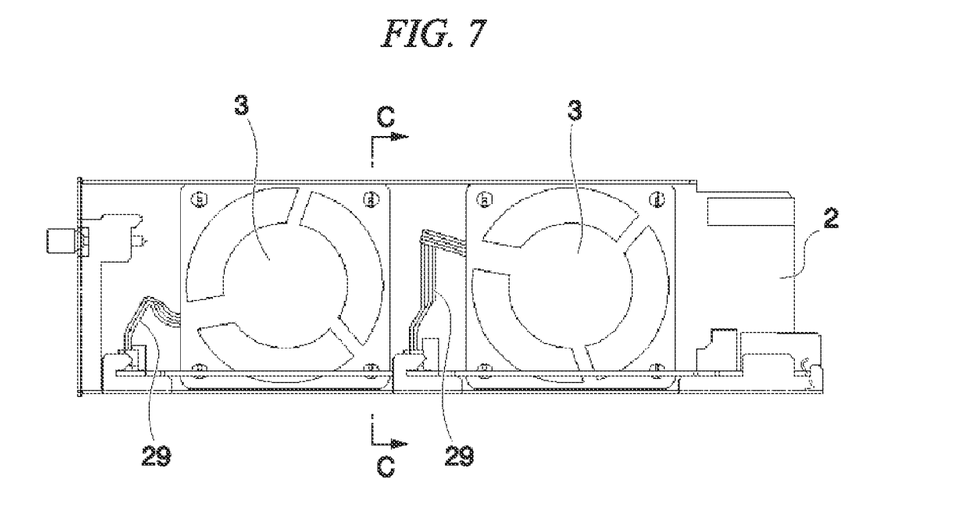
FIG. 7 is a front view of the fan unit seen from direction A of FIG. 3.

The fan connectors 42 are provided at the front end of the circuit board part 41, and between the two notch parts 44. To each fan connector 42 there is connected a power supply cord 29 of the fan main body 3 (refer to FIG. 7).

The control connector 5 is provided at the rear end of the circuit board part 41. The control connector 5 is attached so that the connection part faces the rear side. Accordingly, by inserting the fan unit 1 into the slot 37 to be butted with the mother board 38 (refer to FIG. 2), the connector 39 on the mother board 38 and the control connector 5 of the fan unit 1 are connected with each other.

Figure 6:
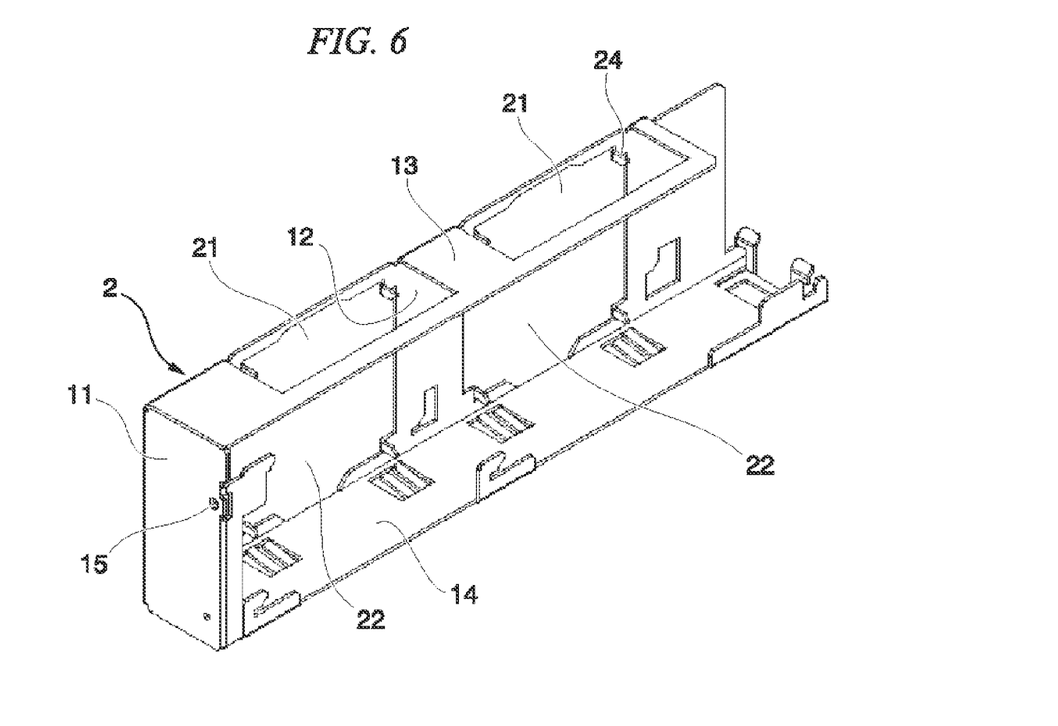
FIG. 6 is a perspective view of a fan chassis that constitutes the fan unit of the present exemplary embodiment.

As shown in FIG. 6, the fan chassis 2 is configured from a single metal sheet composed of a steel plate, a stainless steel sheet, or the like. The fan chassis 2 has a front panel 11, a wall panel 12, an upper panel 13, and a lower panel 14. The front panel 11 is arranged on the same plane as that of the opening of the casing 31. The front panel 11 is of a rectangular shape that is long in the vertical direction. The wall panel 12 extends in the depth direction from one edge of the front panel 11 in the left-right direction. The upper panel 13 and the lower panel 14 extend in the left-right direction from both vertically opposite edges of the wall panel 12.

At a predetermined position of the front panel 11 there is formed a female screw hole 15. To this female screw hole 15 there is attached a thumb screw 16 (refer to FIG. 3). With this thumb screw 16 being threadably fitted into a screw hole in a plate piece (not shown in figure) provided in the casing 31, the fan unit 1 is fixed on the casing 31 of the communication device 30.

The wall panel 12, the upper panel 13, and the lower panel 14 form a U-shape when seen in front view. The fan chassis 2 is deformable elastically in a direction in which the upper panel 13 and the lower panel 14 move apart from each other. That is to say, the upper panel 13 deforms elastically in a direction of moving apart from the lower panel 14. Moreover, the lower panel 14 deforms elastically in a direction of moving apart from the upper panel 13. In more detail, the upper panel 13 deforms elastically so that the edge opposite to the edge of the upper panel 13 that connects with the wall panel 12 moves apart from the lower panel 14. Moreover, the upper panel 13 deforms elastically so that the edge opposite to the edge of the lower panel 14 that connects with the wall panel 12 moves apart from the upper panel 13. The fan main body 3 is accommodated so that the other surface 18 of the fan main body 3 comes in contact with the wall panel 12.

In the upper panel 13 there are formed two fan through holes 21. The length of each fan through hole 21 in the depth direction is substantially the same as the width of the fan main body 3. The length of each fan through hole 21 in the left-right direction is substantially the same as the thickness of the fan main body 3. That is to say, the shape of each fan through hole 21 when seen in plan view is substantially same as the shape of the casing 6 of the fan main body 3 when seen in plan view.

Figure 9:
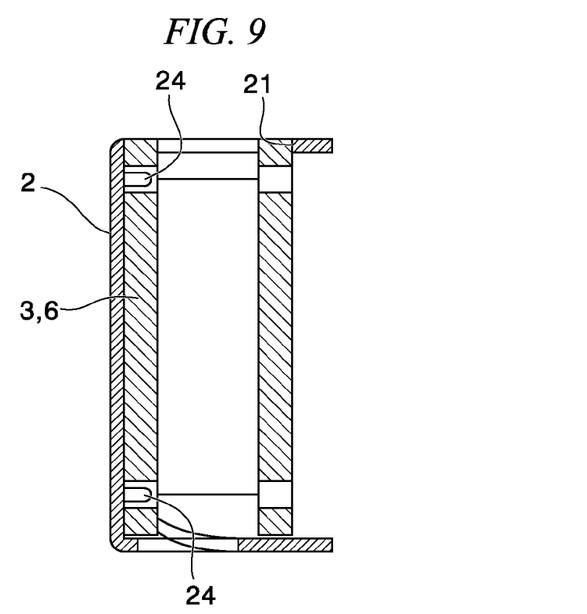
FIG. 9 is a cross sectional view taken along line C-C of FIG. 7.

As described in detail later, the inner dimension of the surfaces of the upper panel 13 and the lower panel 14 that face each other is formed slightly narrower than the outer dimension (height) of the fan main body 3 in the vertical direction. When accommodating the fan main body 3 in the fan chassis 2, the upper panel 13 and the lower panel 14 are slightly press-widened. In this press-widened state, the fan main body 3 is accommodated in the U-shaped space of the fan chassis 2. As shown in FIG. 9, the fan through hole 21 is configured so that the casing 6 of the fan main body 3 is inserted thereinto when the fan main body 3 is accommodated in the fan chassis 2.

Figure 8:
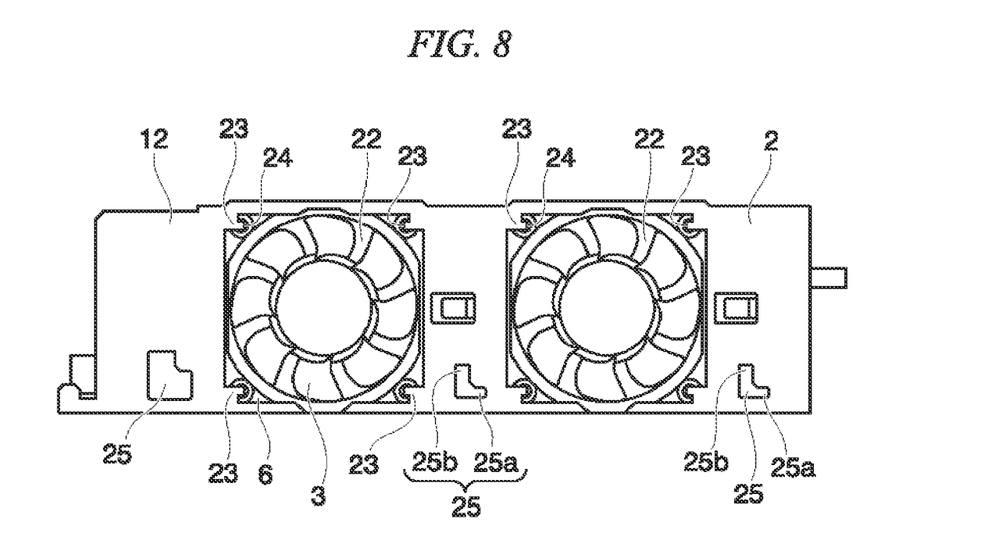
FIG. 8 is a rear view of the fan unit seen from direction B of FIG. 3.

As shown in FIG. 8, in the wall panel 12 there are formed two ventilation holes 22 corresponding to the positions of the accommodated fan main bodies 3. The ventilation holes 22 are formed so as to allow wind flow created by the fan main bodies 3, to sufficiently pass therethrough. Furthermore, each ventilation hole 22 has a shape such that the four corners of the casing 6 of the fan main body 3 come in contact with the wall panel 12. The four corners of the casing 6 come in contact with contact parts 23. At each contact part 23 there is provided a projection 24 that projects toward the fan main body 3 side. The projection 24 is formed by bending a part of the contact part 23. Moreover, each projection 24 is provided at a position that corresponds to each attachment hole 20 of the fan main body 3. As shown in FIG. 9, the projections 24 are configured so as to be inserted into the attachment holes 20 when the fan main body 3 is accommodated in the U-shaped space.

In the wall panel 12 there are formed three irregularly-shaped first insertion parts 25. Three first projection pieces 45 of the control circuit board 4 are to be inserted into the three first insertion parts 25. Among these three first insertion parts 25, two front first insertion parts 25 respectively have a notch part 25a and an interference avoidance part 25b. The first projection piece 45 is to be inserted into the notch part 25a. The interference avoidance part 25b is provided in order to avoid interference between the first insertion part 25 and the wall panel 12 when attaching the control circuit board 4 to the fan chassis 2. The width of the notch part 25a in the vertical direction is formed slightly shorter than the thickness of the circuit board part 41 of the control circuit board 4. The control circuit board 4 is fixed on the fan chassis 2 by inserting the first projection pieces 45 of the circuit board part 41 into the notch parts 25a.

Figure 10:
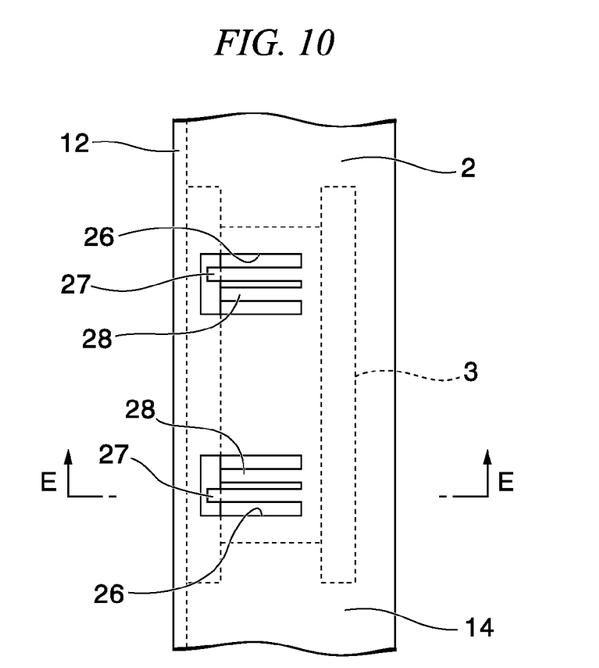
FIG. 10 is a bottom view of the fan unit seen from direction D of FIG. 2.
Figure 11:
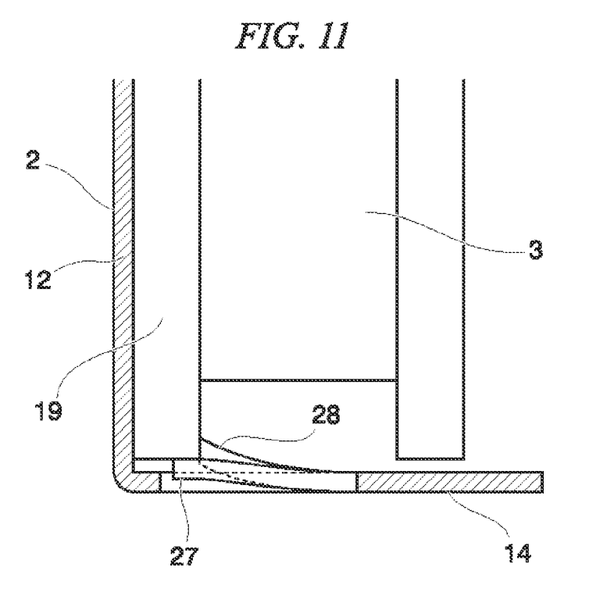
FIG. 11 is a cross sectional view taken along line E-E of FIG. 10.

As shown in FIG. 10, in the lower panel 14 there are provided four pressing prong parts 26. The pressing prong parts 26 are formed at both ends in the depth direction at the accommodating location for each of the fan main bodies 3. Each pressing prong part 26 has a first prong 27 and a second prong 28. The first prong 27 extends in the direction along the wall panel 12 from the substantially center of the lower panel 14 in the left-right direction. The second prong 28 is slightly shorter than the first prong 27. As shown in FIG. 11, the first prong 27 and the second prong 28, at the base portions thereof, are slightly angled so that the tip ends thereof rise upward.

The first prong 27, when the fan main body 3 is accommodated, presses the rib 19 of the casing 6 of the fan main body 3 from the lower side. The tip end part of the second prong 28, when the fan main body 3 is accommodated, engages with the inner side surface of the rib 19 of the casing 6 of the fan main body 3.

Figure 13:
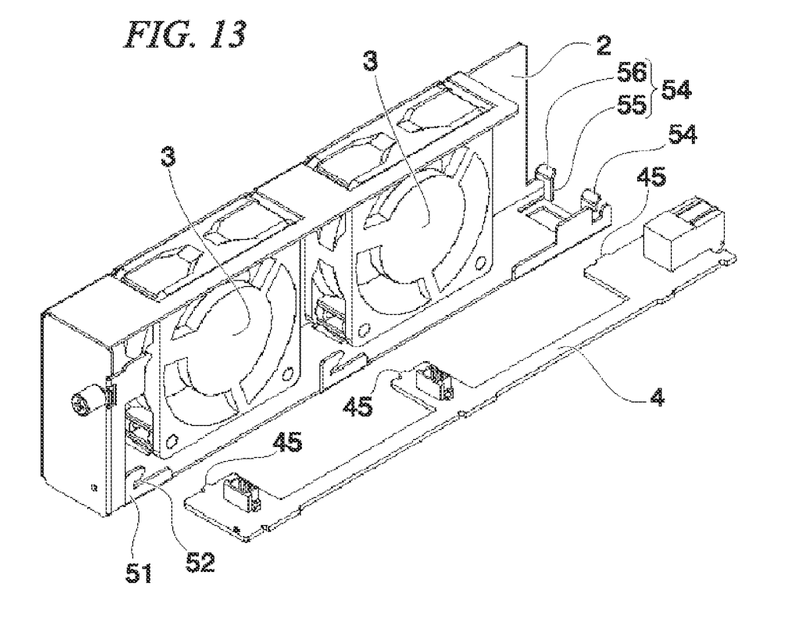
FIG. 13 is a diagram showing an assembly step of the fan unit of the present exemplary embodiment.
Figure 14:
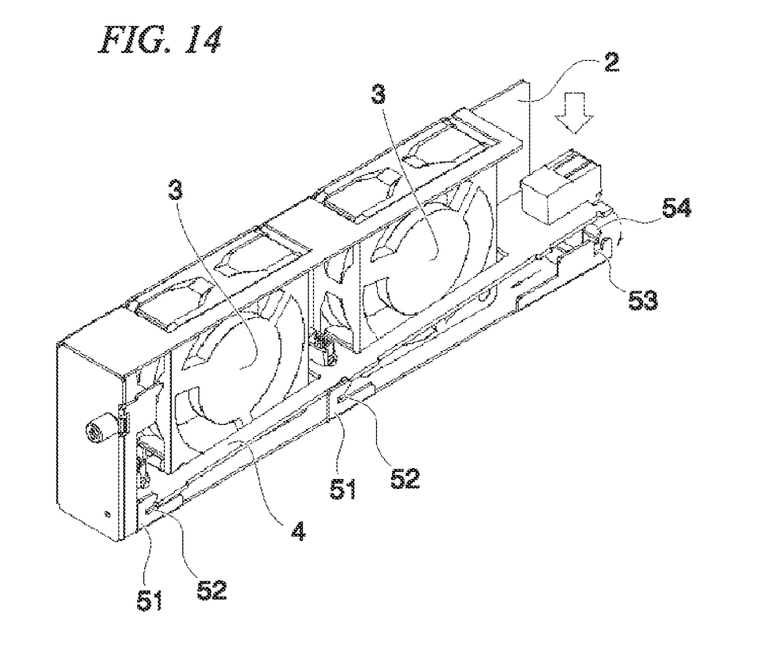
FIG. 14 is a diagram showing an assembly step of the fan unit of the present exemplary embodiment.

As shown in FIG. 13 and FIG. 14, on the other edge of the lower panel 14 on the opposite side to the wall panel 12, there are formed second insertion parts 51. The second insertion parts 51 extend upward. In the second insertion part 51, there is formed a notch part 52. The second projection piece 46 of the control circuit board 4 is to be inserted from the rear side into the notch part 52. The width of the notch part 52 in the vertical direction is slightly shorter than the thickness of the circuit board part 41 of the control circuit board 4. The control circuit board 4 is fixed on the fan chassis 2 by inserting the second projection pieces 46 of the circuit board part 41 into the notch parts 52.

As shown in FIG. 14, on both rear end edges in the left-right direction of the lower panel 14, there is formed a third insertion part 53. The third insertion part 53 is a U-shaped groove having an upward opening. The third insertion part 53 is configured such that the third projection piece 47 of the control circuit board 4 is inserted from upper side. The width of the third insertion part 53 in the front-rear direction is wider than the width of the third projection piece 47 in the front-rear direction. Thereby, even when the third projection piece 47 is inserted into the third insertion part 53, the third insertion part 53 will not restrain the third projection piece 47. Accordingly, the rear end of the control circuit board 4 with the third projection piece 47 formed thereat is of a configuration having freedom with respect to the fan chassis 2. That is to say, the rear end of the control circuit board 4 is not restrained very much by the fan chassis 2.

At the rear end of the lower panel 14 there are provided a pair of circuit board retention parts 54. The circuit board retention part 54 includes a spring piece 55 and a guide part 56. The spring piece 55 extends upward from the rear end of the lower panel 14. The guide part 56 extends diagonally backward and upward from the upper end of the spring piece 55. The spring piece 55 is formed so as to slightly tilt forward from the rear end of the lower panel 14.

Next, the assembly steps of the fan unit 1 are described.

Figure 12:
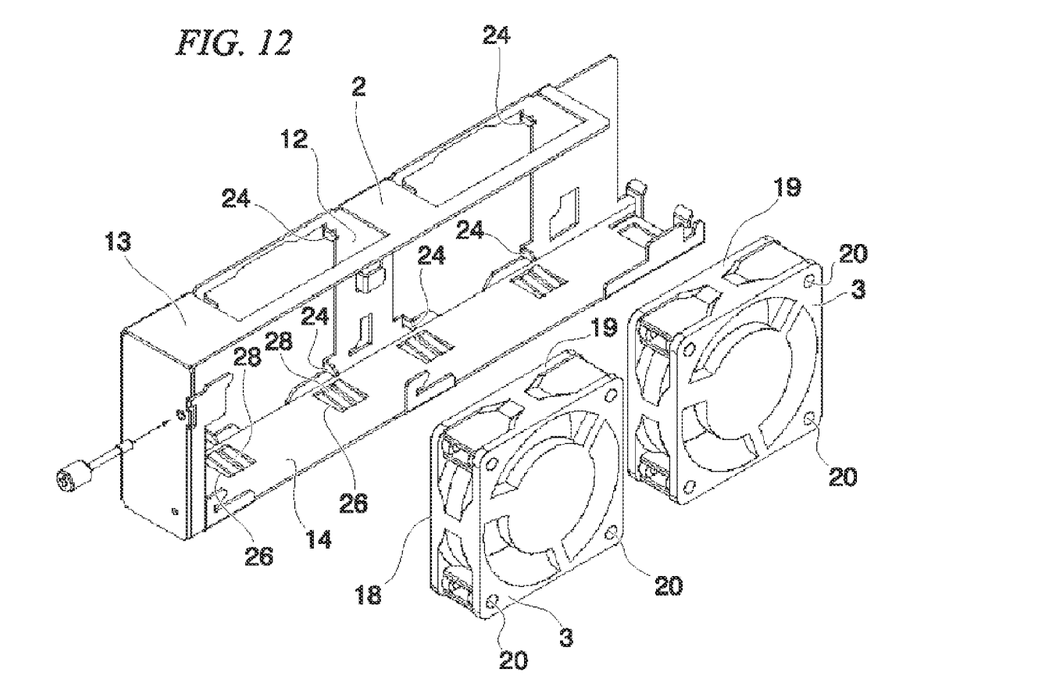
FIG. 12 is a diagram showing an assembly step of the fan unit of the present exemplary embodiment.

First, as shown in FIG. 12, two of the fan main bodies 3 are inserted from the right hand side of the fan chassis 2. At this time, interference between the rib 19 of the casing 6 and the fan chassis 2 is avoided by press-widening the upper panel 13 and the lower panel 14 in a manner such that they are moved apart from each other. After the other surface 18 of the fan main body 3 has been pressed into a position where it comes in contact with the wall panel 12, the press-widening is released. Thereby, the movement of the fan main body 3 in the left direction is restricted by the wall panel 12, while its movement in the right direction is restricted by the fan through hole 21.

Moreover, at the same time, the plurality of projections 24 of the fan chassis 2 are respectively inserted into the attachment holes 20 of the casing 6 (refer to FIG. 9). Thereby, the movement of the fan main body 3 in the vertical direction and the front-rear direction with respect to the fan chassis 2 is restricted. Furthermore, the second prong 28 of the pressing prong part 26 climbs over the rib 19 of the casing 6, and the tip end of the second prong 28 engages with the rib 19 from the inner side. Thereby, the fan main body 3 is fixed on the fan chassis 2.

Next, as shown in FIG. 13, the control circuit board 4 is inserted from the right hand side of the fan chassis 2. At this time, the control circuit board 4 is inserted slightly diagonally so that the tip end of the control circuit board 4 is positioned at the entry of the notch part 52 of the second insertion part 51, and the rear end of the control circuit board 4 is positioned above the tip end. Moreover, at this time, the first projection piece 45 is inserted into the interference avoidance part 25b of the first insertion part 25 (refer to FIG. 8).

Subsequently, as shown in FIG. 14, the second projection piece 46 is inserted into the notch part 52 of the second insertion part 51, while the third projection piece 47 is inserted into the third insertion part 53. Moreover, at this time, the rear end of the control circuit board 4 climbs over the guide part 56 of the circuit board retention part 54 to be thereby retained by the circuit board retention part 54. Thereby, the control circuit board 4 is fixed on the fan chassis 2.

According to the exemplary embodiment above, the fan chassis 2 has a structure in which the fan through hole 21, the second prong 28 of the pressing prong part 26, and the projection 24 retain the fan main body 3. With this structure, the need for fastening members such as screws for fixing the fan main body 3 is eliminated. As a result, it is possible to reduce the number of components and reduce assembly processing steps.

Moreover, the fan chassis 2 has a structure in which the notch part 25a of the first insertion part 25, the notch part 52 of the second insertion part 51, the third insertion part 53, and the circuit board retention part 54 retain the control circuit board 4. With this structure, the need for fastening members such as screws for fixing the control circuit board 4 is eliminated. As a result, it is possible to reduce the number of components and reduce assembly processing steps.

Furthermore, the rear end of the control circuit board 4 has freedom with respect to the fan chassis 2. Consequently, fitting operations of the control connector 5 is improved. Furthermore, when being transported, it is possible to prevent an excessive level of load from being applied to the control connector 5.

Moreover, the upper surface of the fan main body 3 passes through the fan through hole 21 to be thereby exposed. Accordingly, the upper surface of the fan main body 3 becomes the upper surface of the fan unit 1. As a result, the fan unit 1 can be further miniaturized.

Furthermore, the fan chassis 2 is formed from a single metal sheet. Therefore, the fan unit 1 can be manufactured at lower cost.

The technical scope of the present invention is not limited by the exemplary embodiment above, and various types of modifications may be made without departing from the scope of the invention.

Figure 15:
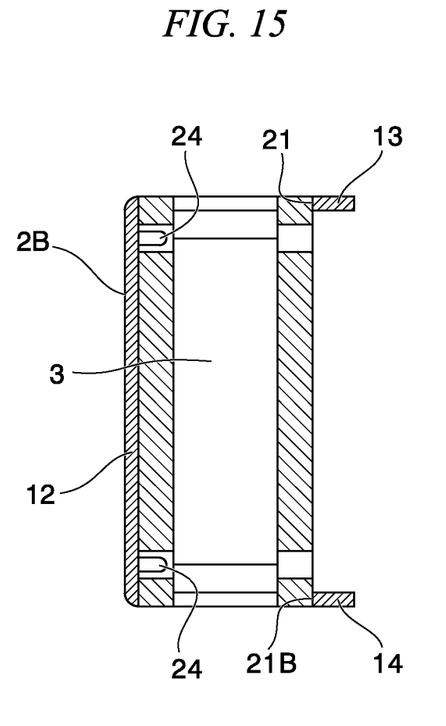
FIG. 15 is a cross sectional view showing a fan unit of another exemplary embodiment.

For example, as shown in FIG. 15, the configuration may be such that a fan through hole 21B may also be provided in the lower panel 14 as well as in the upper panel 13. In this configuration, the movement of the fan main body 3 is restricted by the upper and lower fan through holes 21 and 21B, and the projections 24.

According to this exemplary embodiment, the maximum outer height of the fan unit 1 can be made substantially the same as that of the maximum outer shape of the fan main body 3. As a result, the fan unit can be easily miniaturized further.

This application is based upon and claims the benefit of priority from Japanese patent application No. 2011-074736, filed Mar. 30, 2011, the disclosure of which is incorporated herein in its entirety by reference.

INDUSTRIAL APPLICABILITY

The present invention may be applied to a fan chassis, a fan unit, and a communication device.

REFERENCE SYMBOLS

1 Fan unit
2 Fan chassis
3 Fan main body (fan)
4 Control circuit board
5 Control connector (connector)
6 Casing
12 Wall panel
13 Upper panel
14 Lower panel
20 Attachment hole
21 Fan through hole (through hole)
22 Ventilation hole
24 Projection
25 First insertion part
28 Second prong (prong part)
30 Communication device (electronic device)
31 Casing
37 Slot
45 First projection piece
46 Second projection piece
47 Third projection piece
51 Second insertion part
53 Third insertion part (U-shaped insertion part)
54 Circuit board retention part

The invention claimed is:

1. A fan chassis comprising:
a wall panel; and
an upper panel that is connected to an upper end of the wall panel, and a lower panel that is connected to a lower end of the wall panel, a cross sectional shape of the upper panel, the lower panel, and the wall panel being substantially U-shape, wherein:
the wall panel includes a plurality of projections to be inserted into mounting holes of a fan;
at least either one of the upper panel and the lower panel includes a through hole into which an upper end part or a lower end part of the fan is to be fitted;
an inner dimension between the upper panel and the lower panel is shorter than an outer dimension of the fan in a vertical direction; and
the upper panel and the lower panel deform elastically in a direction in which the upper panel and the lower panel move apart from each other.

2. The fan chassis according to claim 1, wherein either one of the upper panel and the lower panel includes a prong part that engages with the fan.

3. A fan unit comprising:
a fan chassis according to claim 1; and
a fan that is fitted on the fan chassis.

4. The fan unit according to claim 3, further comprising:
a control circuit board that is provided parallel with the upper panel and the lower panel of the fan chassis, wherein the fan chassis further comprises:
a first insertion part that retains a first end of the control circuit board so as to restrict the control circuit board from moving in one direction; and a circuit board retention part that elastically biases a second end of the control circuit board toward the one direction.

5. The fan unit according to claim 4, wherein the fan chassis further comprises a second insertion part, the second insertion part having an upward opening, the second end of the control circuit board being inserted into the second insertion part.

6. The fan unit according to claim 4, wherein:
the control circuit board includes a connector at the second end, the connector connecting a predetermined communication device and the control circuit board when the fan unit is inserted into a slot provided in a casing of the communication device; and
the circuit board retention part has an elastic force of retaining the second end of the control circuit board.

7. The fan unit according to claim 3, wherein the fan chassis is formed from a single metal sheet.

8. A communication device comprising:
a casing including a plurality of slots;
a communication unit; and
a fan unit according to claim 3,
wherein the communication unit and the fan unit are inserted into the plurality of slots.

\* \* \* \* \*